(12) United States Patent
Shim

(10) Patent No.: US 7,632,699 B2
(45) Date of Patent: Dec. 15, 2009

(54) METHOD FOR MANUFACTURING CMOS IMAGE SENSOR

(75) Inventor: Hee Sung Shim, Gangneung-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 302 days.

(21) Appl. No.: 11/612,600

(22) Filed: Dec. 19, 2006

(65) Prior Publication Data
US 2007/0155081 A1    Jul. 5, 2007

(30) Foreign Application Priority Data
Dec. 29, 2005    (KR) .................... 10-2005-0134404

(51) Int. Cl.
*H01L 21/00*    (2006.01)
(52) U.S. Cl. ................... 438/59; 438/58; 438/48; 438/22; 257/291; 257/292; 257/E27.131; 257/E27.133
(58) Field of Classification Search ............. 438/48–59; 257/291–292
See application file for complete search history.

(56) References Cited
U.S. PATENT DOCUMENTS

| | | | |
|---|---|---|---|
| 5,479,034 A | 12/1995 | Hashimoto et al. | |
| 5,917,207 A | 6/1999 | Colwell et al. | |
| 6,927,090 B2 * | 8/2005 | Rhodes | 438/59 |
| 7,037,771 B2 * | 5/2006 | Rhodes | 438/197 |
| 2004/0082154 A1 | 4/2004 | Lim | |
| 2006/0279649 A1 * | 12/2006 | Cole | 348/308 |

* cited by examiner

*Primary Examiner*—Dung A. Le
(74) *Attorney, Agent, or Firm*—Saliwanchik, Lloyd & Saliwanchik

(57) ABSTRACT

A method for manufacturing a CMOS image sensor that independently forms a poly routing line connected to a gate poly of a reset transistor is provided. In an embodiment, a semiconductor substrate is prepared defining a device isolation region and an active region. Subsequently, a plurality of gate polys are formed on a predetermined portion of the active region. A photodiode is formed in a portion of the semiconductor substrate located at one side of one of the plurality of gate polys. After an oxide layer is deposited on the semiconductor substrate including the gate polys, the oxide layer is selectively removed to form oxide layer patterns for exposing a portion of the plurality of gate polys. After a polysilicon layer is deposited on the oxide layer pattern, the polysilicon layer is selectively removed to form a routing line connected to the portion of the plurality of gate polys.

10 Claims, 7 Drawing Sheets

US 7,632,699 B2

METHOD FOR MANUFACTURING CMOS IMAGE SENSOR

RELATED APPLICATION(S)

This application claims the benefit under 35 U.S.C. §119 (e) of Korean Patent Application No. 10-2005-0134404 filed Dec. 29, 2005, which is incorporated herein by reference in its entirety.

FIELD OF THE INVENTION

The present invention relates to a complementary metal oxide semiconductor (CMOS) image sensor, and more particularly, to a method for manufacturing a CMOS image sensor capable of independently forming a poly routing line connected to a gate poly of a reset transistor.

BACKGROUND OF THE INVENTION

In general, image sensors are semiconductor devices for converting an optical image into an electrical signal. In a charge coupled device (CCD), charge carriers are stored in and transferred to closely formed individual MOS capacitors The CCD uses a complicated driving method and consumes a lot of power. A CCD has many disadvantages such as a large number of mask operations and inability to incorporate a signal processing circuit within a CCD chip such that it is difficult to integrate a CCD on a single chip. Therefore, a CMOS image sensor using a sub-micron CMOS manufacturing technology is under development in order to overcome these disadvantages.

CMOS image sensors are formed using CMOS technology and incorporate MOS transistors corresponding to each unit pixel, and a control circuit and a signal processing circuit as peripheral circuits, where a switching method is used for sequentially detecting outputs by employing the MOS transistors.

In general, a CMOS image sensor includes a photodiode (PD) and a MOS transistor within a unit pixel, and realizes an image by sequentially detecting signals using a switching method. Since a CMOS image sensor uses CMOS manufacturing technology, the CMOS image sensor has low power consumption, typically requires about 20 masks, and has a very simple manufacturing process compared to a CCD process, which requires about 30-40 masks. In addition, a variety of signal processing circuits within the CMOS image sensor can be realized in one-chip. Accordingly, the CMOS image sensor is in the limelight as the next generation image sensor and is widely used in a variety of applications such as digital still cameras (DSC), personal computer (PC) cameras, and mobile cameras.

CMOS images sensors are generally classified into 3T type CMOS image sensors, 4T type CMOS image sensors, or 5T type CMOS image sensors depending on the number of transistors formed in a unit pixel. The 3T type CMOS image sensor includes one PD and three transistors. The 4T type CMOS image sensor includes one PD and four transistors. A related art CMOS image sensor will be described with reference to the accompanying drawings.

FIG. 1 is an equivalent circuit diagram of a general 4T type CMOS image sensor, and FIG. 2 is a lay-out diagram illustrating a unit pixel of a general 4T type CMOS image sensor.

Referring to FIGS. 1 and 2, a unit pixel of the 4T type CMOS image sensor includes a photodiode (PD) 10 as a photo-electric converting part, and four transistors Tx, Rx, Dx, and Sx.

Here, the four transistors are a transmission transistor Tx 20, a reset transistor Rx 30, a drive transistor Dx 40, and a select transistor Sx 50. Also, a load transistor 65 is electrically connected to a drain terminal of the select transistor that serves as an output terminal for the unit pixel.

In the unit pixel of the related art 4T type CMOS image sensor illustrated in FIG. 2, an active region and a device isolation region are defined. The photodiode PD is formed at the wide portion of the active region, and gate electrodes 23, 33, 43 and 53 of the four transistors Tx, Rx, Dx, and Sx, respectively, are formed overlapping the narrow portion of the active region.

FIG. 3 is a lay-out diagram for describing a poly routing method of a CMOS image sensor according to the related art.

Referring to FIG. 3, gates of the respective transistors Tx, Rx, Dx, and Sx of the 4T type CMOS image sensor are formed in shapes of gate electrodes 23(a and b), 33(a and b), 43(a and b), and 53(a and b). Photodiodes (PD) 10a and 10b are formed in the substrate at one side of Tx gate electrodes 23a and 23b. N+ type well regions are formed on a surface of a portion of the semiconductor substrate that is located at both sides of the gate electrodes 23(a and b), 33(a and b), 43(a and b), and 53(a and b) to serve as source/drain regions for each transistor.

Also, a predetermined portion of an N+ type well region between the gate electrodes 23, 33, 43, and 53 of the each transistor is defined as a floating diffusion node (FD).

Where a PD of a CMOS image sensor changes into a salicide, a leakage characteristic remarkably deteriorates, and causes a great increase of dark current.

Therefore, to prevent a PD from changing into salicide, a plasma enhanced tetra ethyl ortho silicate (PE-TEOS)-based oxide layer, which is a salicide blocking layer, is deposited. Then, a non-salicide mask for etching the PE-TEOS layer is disposed around PDs 10a and 10b as illustrated by the dotted lines in FIG. 3.

At this point, since a salicide blocking oxide layer is removed primarily using wet etching, the non-salicide mask is disposed to have a margin around the PDs so as to secure a process margin.

In this case, the poly routing line of a pixel part partially remains as a non-salicide portion due to the non-salicide mask, and resistance of the poly routing line increases. When the resistance of the poly routing line increases, an RC delay is generated.

FIG. 4 is a lay-out diagram for illustrating another poly routing method of a CMOS image sensor according to the related art.

Referring to FIG. 4, not only a PD region but also a floating diffusion node (FD) in a unit pixel is prevented from being salicided in order to improve low illumination characteristic of a CMOS image sensor. Here, the space between the salicide blocking masks is narrow, making it difficult to use a current mid ultra violet (MUV) process, which results in a reduction in yield.

In addition, as shown in FIG. 4, a portion of a poly routing line also partially remains as a non-salicide portion due to the mask shown with a dotted line in FIG. 4.

BRIEF SUMMARY

Accordingly, embodiments of the present invention are directed to a method for manufacturing a CMOS image sensor that can substantially obviate one or more problems due to limitations and disadvantages of the related art.

An object of embodiments of the present invention is to provide a method for manufacturing a CMOS image sensor, which is capable of achieving a uniform non-salicide area.

Additional advantages, objects, and features of the invention will be set forth in part in the following description and will become apparent to those of ordinary skill in the art upon examination or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing a complementary metal oxide semiconductor image sensor, the method including: preparing a semiconductor substrate where a device isolation region and an active region are defined; forming a plurality of gate polys on a predetermined portion of the active region; forming a photodiode in a portion of the semiconductor substrate that is located at one side of the gate polys; after depositing an oxide layer on the semiconductor substrate including the gate polys, selectively removing the oxide layer to form oxide layer patterns for opening a predetermined portion of the gate polys; and after depositing a polysilicon layer on the oxide layer patterns, selectively removing the polysilicon layer to form a poly routing line connected to the gate polys The polysilicon layer can be formed of doped silicon, and a salicide process can be performed on the poly routing line after forming the poly routing line.

In another aspect of the present invention, there is provided a method for manufacturing a complementary metal oxide semiconductor image sensor, the method including: forming a photodiode and a plurality of gate polys in a semiconductor substrate; performing a front-end process on the semiconductor substrate in which the photodiode and the plurality of gate polys are formed; and forming a polysilicon layer to form a poly routing line contacting some of the plurality of gate polys.

In a specific embodiment, the polysilicon layer can be a doped polysilicon layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
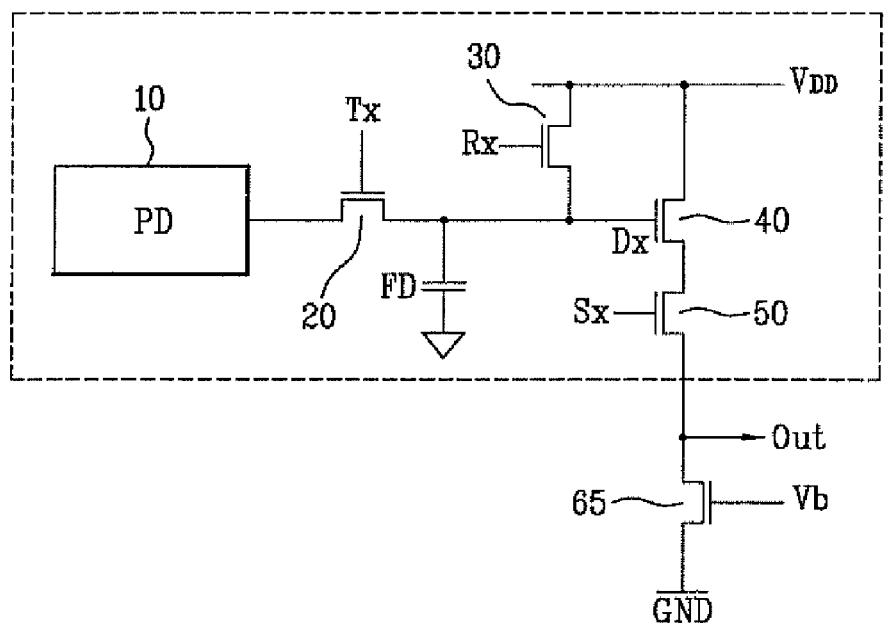
FIG. 1 is an equivalent circuit diagram of a general 4T type CMOS image sensor.
Figure 2:
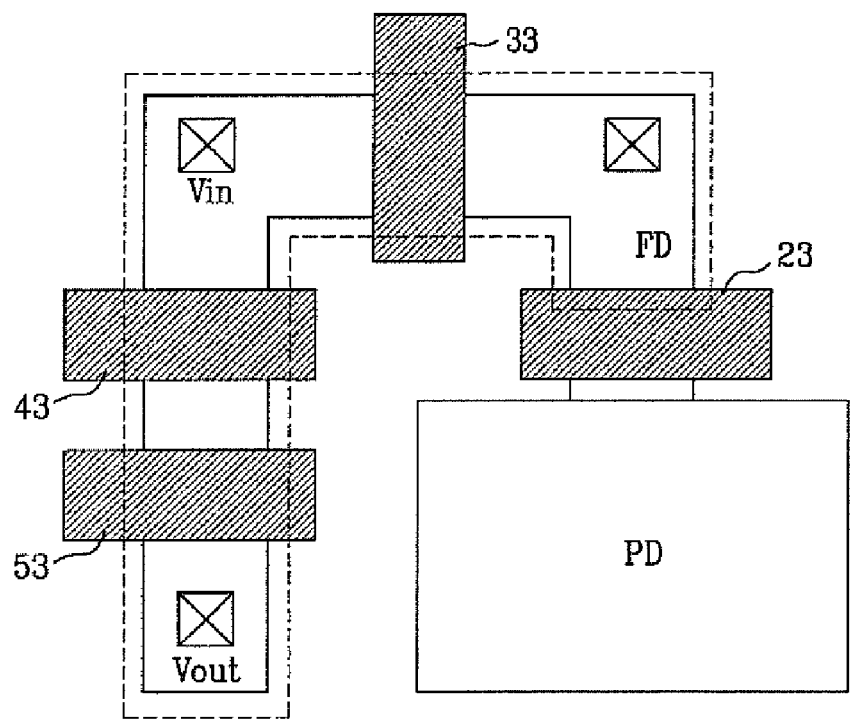
FIG. 2 is a lay-out diagram illustrating a unit pixel of a general 4T type CMOS image sensor.
Figure 3:
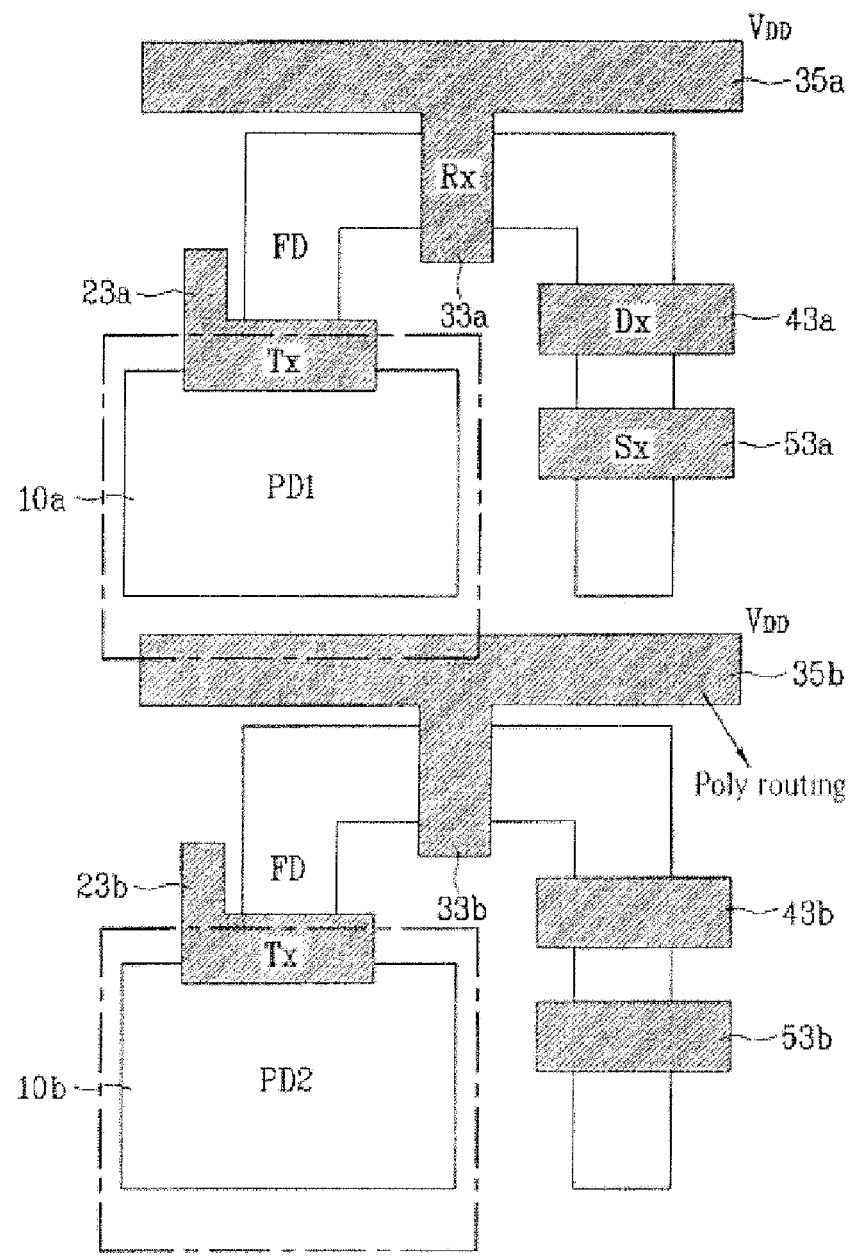
FIG. 3 is a lay-out diagram for illustrating a poly routing method of a CMOS image sensor according to the related art.
Figure 4:
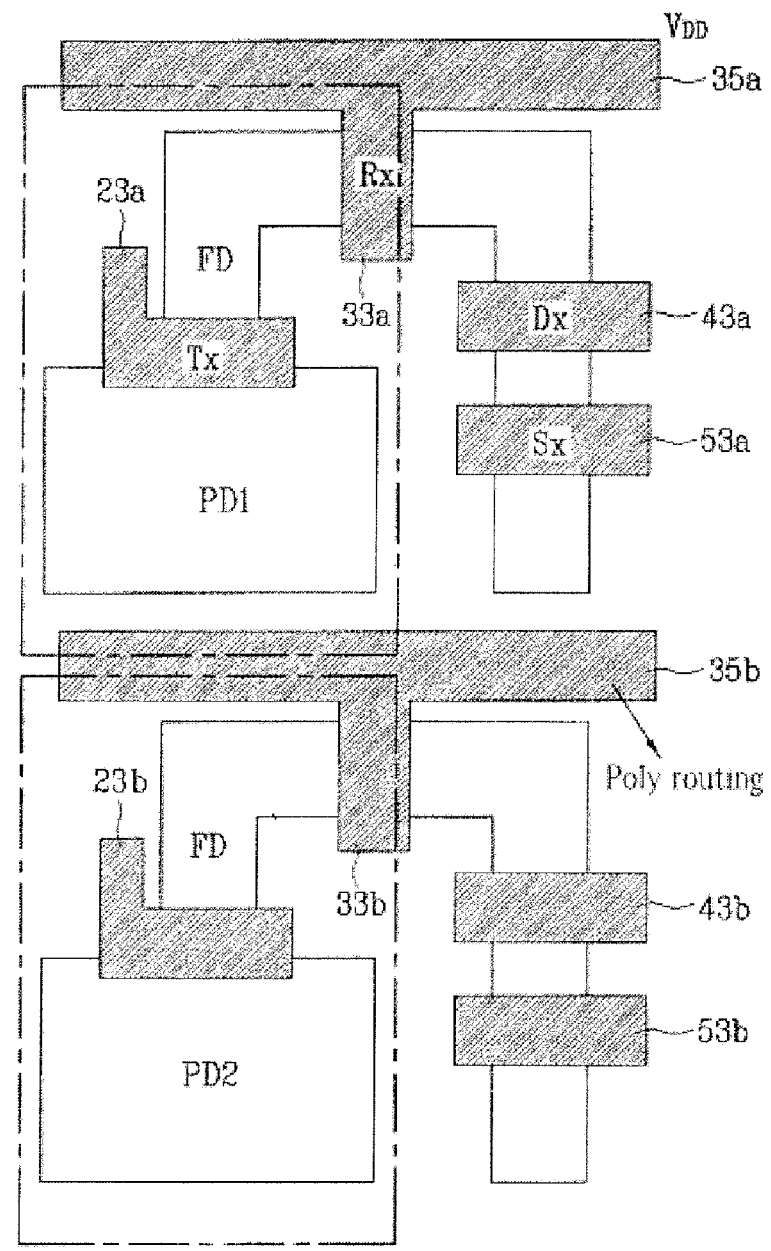
FIG. 4 is a lay-out diagram for illustrating another poly routing method of a CMOS image sensor according to the related art.
Figure 5:
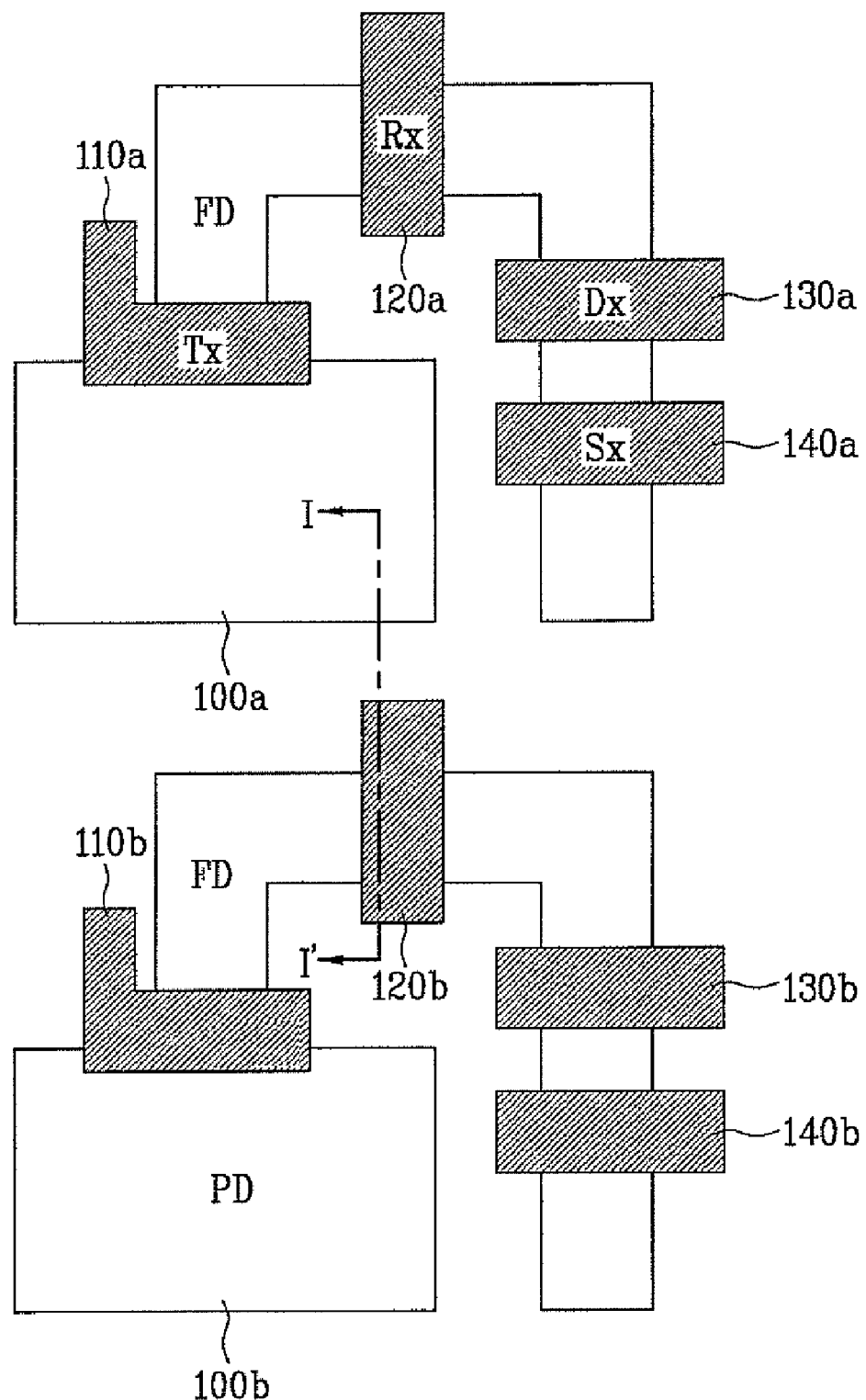
FIG. 5 is a lay-out diagram illustrating forming an active region and a poly layer in a method for manufacturing a CMOS image sensor according to an embodiment of the present invention.
Figure 6:
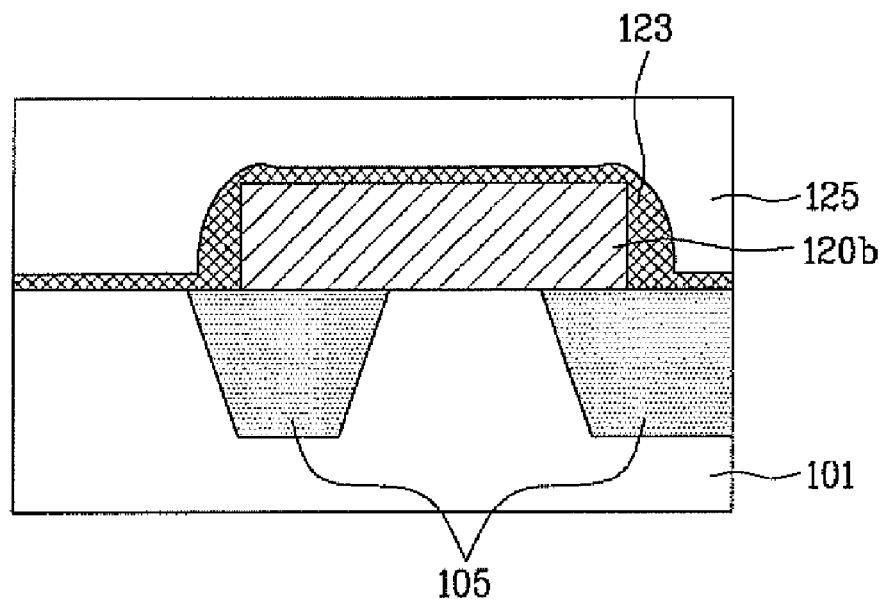
FIG. 6 is a cross-sectional view along line I-I' of FIG. 5.

FIG. 5 is a lay-out diagram illustrating forming an active region and a poly layer in a method for manufacturing a CMOS image sensor according to an embodiment of the present invention, FIG. 6 is a cross-sectional view along line I-I' of FIG. 5, and FIGS. 7A to 7C are cross-sectional views along line I-I' for explaining a method for manufacturing a CMOS image sensor according to an embodiment of the present invention.

According to a preferred method for manufacturing a CMOS image sensor, a semiconductor substrate 101 where a device isolation region and an active region are defined can be prepared. For reference, a device isolation region is typically defined by forming a device isolation layer 105 in the semiconductor substrate 101. The other regions of the semiconductor substrate 101 where the device isolation layer 105 is not formed are generally used as the active region.

Referring to FIG. 5 and FIG. 6, a plurality of gate polys 110a, 110b, 120a, 120b, 130a, 130b, 140a, and 140b for forming a plurality of transistors can be formed on the semiconductor substrate 101. Although description is made using a cross-sectional view of the gate poly 120b in the present invention, the process described for the gate poly 120b can be applied to the other gate polys 110a, 110b, 120a, 130a, 130b, 140a, and 140b in the same way.

After the plurality of gate polys 110a, 110b, 120a, 120b, 130a, 130b, 140a, and 140b are formed, a front-end process for forming pixels constituting the CMOS image sensor can be performed. Because front end processes are well known to a person of ordinary skill in the art, a detailed description thereof will be omitted.

After forming the plurality of gate polys, a salicide process can be performed on the gate polys 110a, 110b, 120a, 120b, 130a, 130b, 140a, and 140b, and an exposed portion of the semiconductor substrate 101. The salicide process is performed to improve conductivity of the gate polys. The photodiode PD and a floating diffusion (FD) region should remain non-salicides. The floating diffusion region FD is the portion of the active region between the gate polys 110a and 110b for a transmission transistor and the gate polys 120a and 120b for a reset transistor, which is the shared source/drain region of the transmission transistor and the reset transistor.

Photodiodes (PDs) 100a and 100b for generating photo-electrons can be formed on a portion of the semiconductor substrate 101 that is located on one side of the gate polys 110a and 110b of the transmission transistor.

Subsequently, as shown in FIG. 6, a spacer 123 can be formed at side portions of the gate polys. In a further embodiment, a portion of the spacer material can remain on the substrate and a top surface of the gate polys.

Figure 7A:
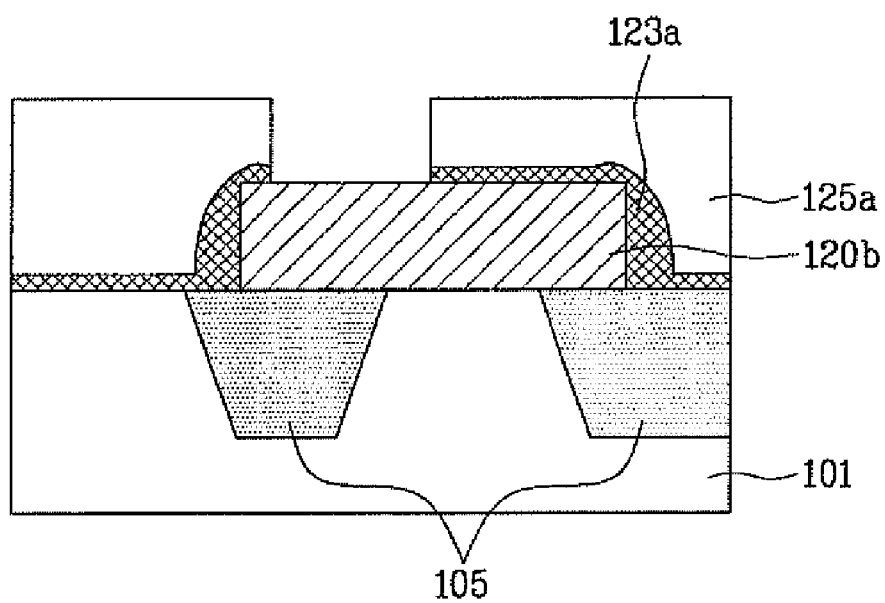
FIGS. 7A to 7C are cross-sectional views illustrating a method for manufacturing a CMOS image sensor according to an embodiment of the present invention.

Subsequently, referring to FIG. 7A, an oxide layer 125a can be deposited on the semiconductor substrate 101 including the gate polys 110a, 110b, 120a, 120b, 130a, 130b, 140a, and 140b.

Next, the oxide layer 125a can then be etched to expose a portion of the gate polys 110a, 110b, 120a, 120b, 130a, 130b, 140a, and 140b. In one embodiment, the portion of the spacer material remaining on the top surface of the gate polys can also be removed so as to expose the portion of the gate polys.

Figure 7B:
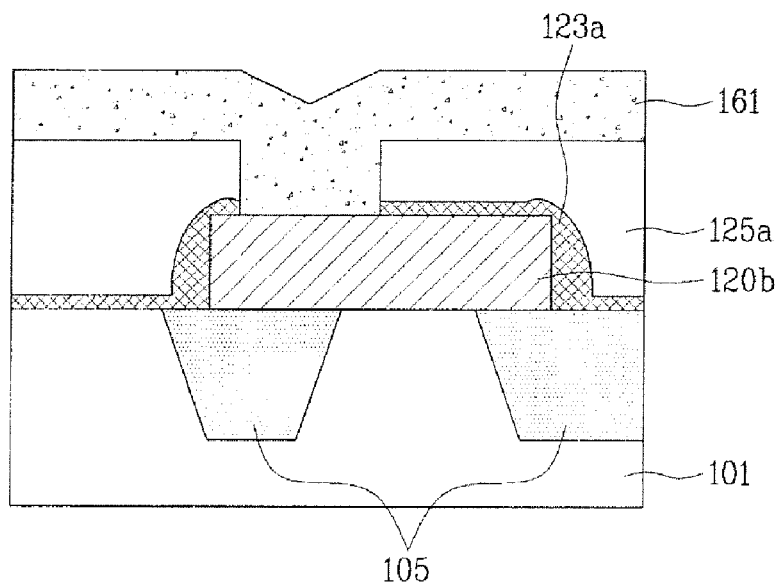

Subsequently, referring to FIG. 7B, a doped polysilicon layer 161 having low resistance can be deposited on an entire surface of the semiconductor substrate 101.

Therefore, the exposed portion of the gate polys 110a, 110b, 120a, 120b, 130a, 130b, 140a, and 140b contacts the doped polysilicon layer 161 as illustrated in the drawing. The doped polysilicon can be polysilicon including impurities. The doped polysilicon has low resistance compared to general polysilicon and thus has excellent conductivity.

Figure 7C:
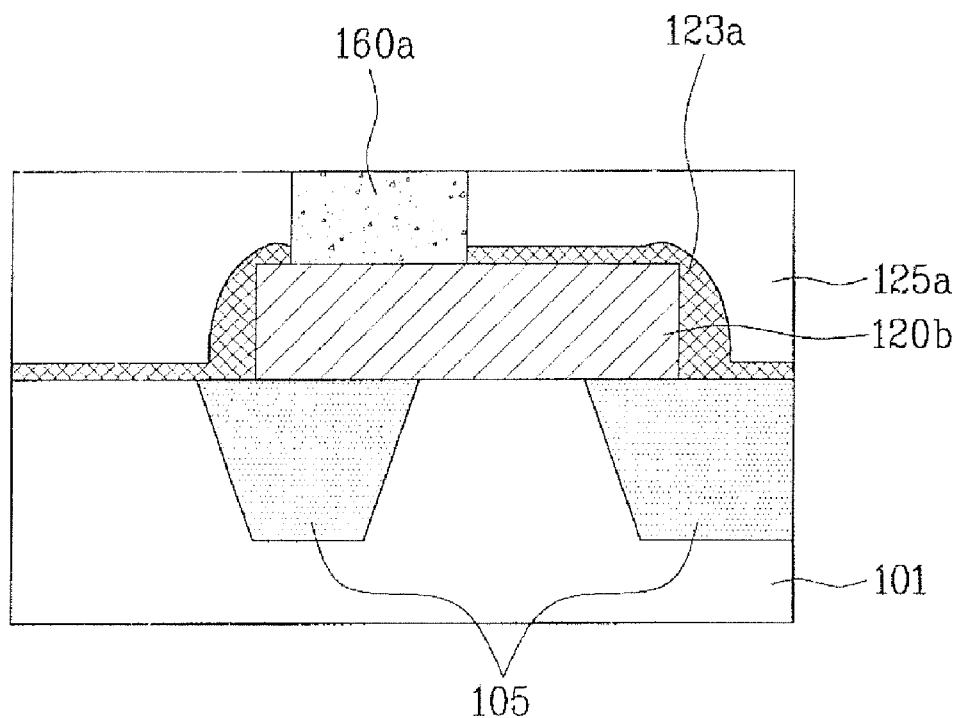
Figure 8:
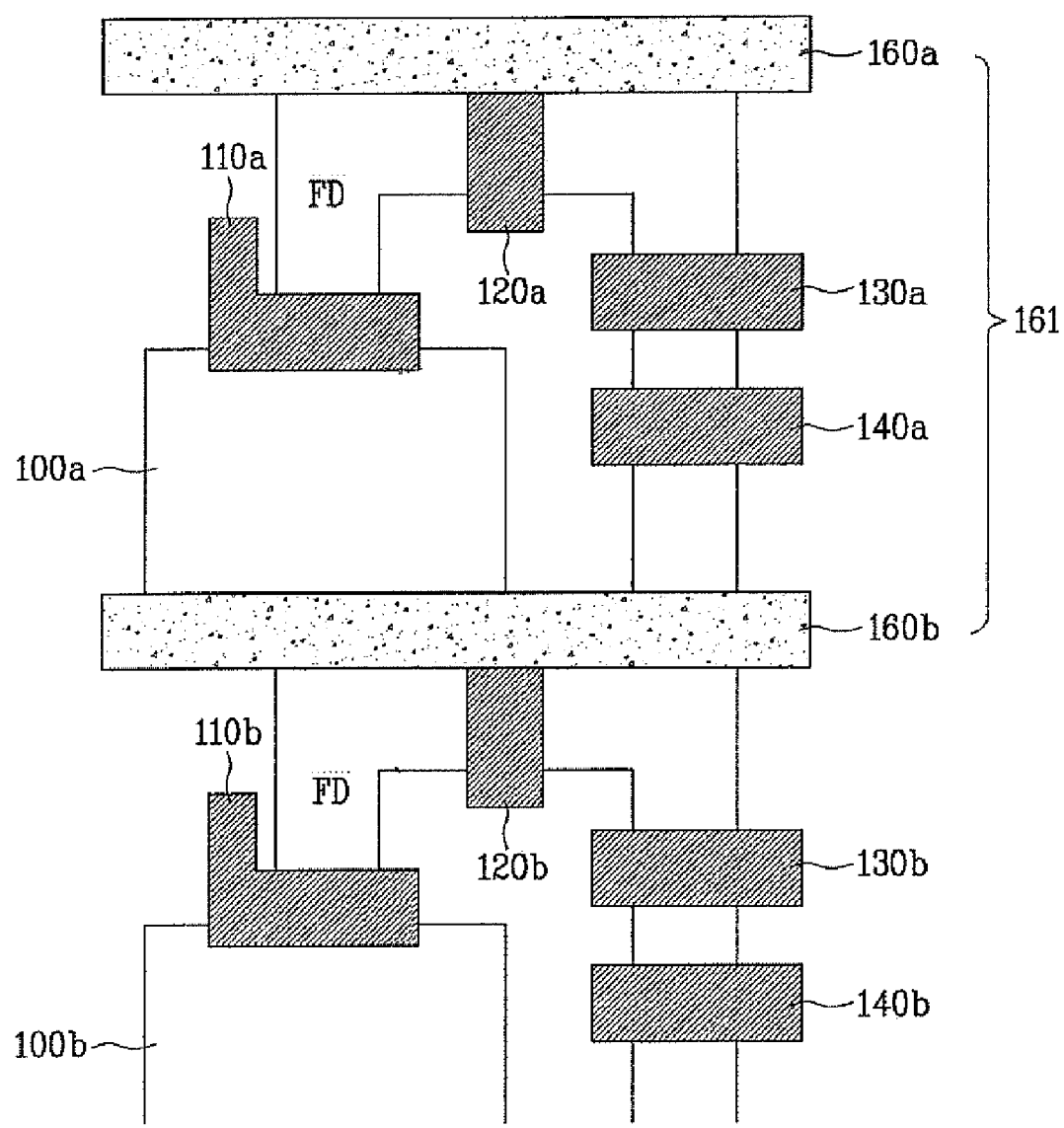
FIG. 8 is a lay-out diagram for illustrating a poly routing of a CMOS image sensor according to an embodiment of the present invention.

Subsequently, etching can be performed on the doped polysilicon layer 161 to form poly routing lines 160a and 160b connected to the gate polys 120 a and 120b as shown in FIGS. 7C and 8. For example, a chemical mechanical polishing (CMP) can be performed to planarize an entire surface of the semiconductor substrate 101. FIG. 7C shows a cross-sectional view after a planarization process is performed.

A structure of the above-formed poly routing lines 160a and 160b is illustrated in FIG. 8. Because a bias voltage is applied to the poly routing lines 160a and 160b, the poly routing lines 160a and 160b need to have excellent conductivities. Therefore, it is preferable that a salicide process is additionally performed on the poly routing lines 160a and 160b to reduce resistance of the poly routing lines 160a and 160b.

As described above, it is preferable that during the salicide process for a unit pixel to manufacture a CMOS image sensor, the photodiode region and the floating diffusion region remain non-salicides, and the poly routing line uniformly changes into a salicide.

However, in the related art, a portion of a poly routing line is not salicided due to difficulty in the masking process. Therefore, the resistance component of the poly routing line increases.

In contrast, according to embodiments of the present invention, after a front-end process for manufacturing pixels constituting a CMOS image sensor is completed, a process for forming a poly routing line can be performed independently.

According to embodiments of the present invention, since a region including a photodiode and a floating diffusion node can be prevented from having a silicide process formed thereon before a poly routing line is formed, it is possible to fundamentally prevent a portion of the poly routing line from not changing into salicide.

Also, according to embodiments of the present invention, the number of metal lines can be reduced, compared to the case where metal routing is used, so that a fill factor of a CMOS image sensor improves.

Also, the process of forming a gate poly and the process of forming a poly routing line can be separately performed, so that a salicide process margin improves greatly compared to the related art.

It will be apparent to those skilled in the art that various modifications and variations can be made in the present invention. Thus, it is intended that the present invention covers the modifications and variations of this invention provided they come within the scope of the appended claims and their equivalents.

For example, a person of ordinary skill in the art could form poly routing lines 160a and 160b contacting gate polys 120a and 120b by using metal lines.

I claim:

1. A method for manufacturing a complementary metal oxide semiconductor image sensor, comprising:
   preparing a semiconductor substrate where a device isolation region and an active region are defined;
   forming a plurality of gate polys on the active region;
   forming a photodiode in a portion of the semiconductor substrate located at one side of one of the plurality of gate polys;
   depositing an oxide layer on the semiconductor substrate including the gate polys, and selectively removing the oxide layer to form oxide layer patterns for opening a predetermined portion of the plurality of gate polys; and
   depositing a polysilicon layer on the oxide layer patterns, and selectively removing the polysilicon layer by performing chemical mechanical polishing to expose the oxide layer patterns while remaining the polysilicon layer in the oxide layer patterns, thereby forming a poly routing line connected to the predetermined portion of the plurality of gate polys and extending over other portions of the semiconductor substrate from the predetermined portion of the plurality of gate polys.

2. The method according to claim 1, wherein the polysilicon layer is formed of silicon doped with impurities.

3. The method according to claim 1, further comprising performing a salicide process on the poly routing line.

4. A method for manufacturing a complementary metal oxide semiconductor image sensor, comprising:
   forming a photodiode and a plurality of gate polys on a semiconductor substrate;
   performing a front-end process on the semiconductor substrate having the photodiode and the plurality of gate polys; and
   depositing a polysilicon layer to form a poly routing line contacting some of the plurality of gate polys and extending over other portions of the semiconductor substrate.

5. The method according to claim 4, wherein the polysilicon layer is formed of doped silicon.

6. The method according to claim 4, further comprising performing a salicide process on the poly routing line.

7. A method for manufacturing a complementary metal oxide semiconductor image sensor, comprising:
   forming a photodiode and a plurality of gate polys on a semiconductor substrate;
   depositing an oxide layer on the semiconductor substrate including the gate polys;
   etching a portion of the oxide layer to form a routing trench overlapping and exposing a portion of at least one of the plurality of gate polys; and
   depositing a polysilicon layer on the oxide layer including in the routing trench, and selectively removing the polysilicon layer to form a poly routing line in the routing trench.

8. The method according to claim 7, wherein the polysilicon layer is formed of silicon doped with impurities.

9. The method according to claim 7, further comprising performing a salicide process on the poly routing line.

10. The method according to claim 7, wherein selectively removing the polysilicon layer comprises performing chemical mechanical polishing (CMP) using the oxide layer as an etch stop.

* * * * *